United States Patent
Jarmon et al.

(10) Patent No.: US 8,313,056 B2
(45) Date of Patent: Nov. 20, 2012

(54) ENGINE HEAT EXCHANGER WITH THERMOELECTRIC GENERATION

(75) Inventors: David C. Jarmon, Kensington, CT (US); Rhonda R. Willigan, Manchester, CT (US); Roy N. Guile, Wethersfield, CT (US)

(73) Assignee: United Technologies Corporation, Hartford, CT (US)

( * ) Notice: Subject to any disclaimer, the term of this patent is extended or adjusted under 35 U.S.C. 154(b) by 1248 days.

(21) Appl. No.: 11/185,638

(22) Filed: Jul. 19, 2005

(65) Prior Publication Data

US 2007/0018038 A1    Jan. 25, 2007

(51) Int. Cl.
*B64D 41/00* (2006.01)
(52) U.S. Cl. .............. 244/58; 60/266; 60/267; 60/768
(58) Field of Classification Search .............. 244/58; 136/205–212, 224–227, 291; 60/266, 267, 60/768, 253–260
See application file for complete search history.

(56) References Cited

U.S. PATENT DOCUMENTS

| | | | |
|---|---|---|---|
| 2,990,775 A | | 7/1961 | Henson |
| 3,733,826 A | * | 5/1973 | Wolf et al. ............ 60/263 |
| 4,065,936 A | * | 1/1978 | Fenton et al. .......... 62/3.3 |
| 4,372,211 A | * | 2/1983 | Dante ............... 102/207 |
| 4,580,524 A | * | 4/1986 | Lackey et al. ......... 118/725 |
| 5,135,184 A | * | 8/1992 | Billig ............... 244/53 R |
| 5,337,975 A | * | 8/1994 | Peinemann ........... 244/53 B |
| 5,584,183 A | * | 12/1996 | Wright et al. .......... 62/3.7 |
| 5,805,973 A | * | 9/1998 | Coffinberry et al. ..... 428/551 |
| 5,874,775 A | * | 2/1999 | Shiomi et al. ......... 257/712 |
| 5,891,584 A | * | 4/1999 | Coffinberry .......... 428/552 |
| 5,923,944 A | * | 7/1999 | Coffinberry et al. ..... 428/551 |
| 6,300,150 B1 | | 10/2001 | Venkatasubramanian |
| 6,499,306 B2 | * | 12/2002 | Gillen ................. 62/129 |
| 6,627,019 B2 | | 9/2003 | Jarmon et al. |
| 6,907,920 B2 | | 6/2005 | Warburton et al. |
| 7,210,653 B2 | * | 5/2007 | Atkey et al. ............ 244/58 |
| 7,254,953 B2 | * | 8/2007 | Callas et al. ........... 62/3.7 |
| 7,273,981 B2 | * | 9/2007 | Bell ................. 136/205 |
| 2003/0066554 A1 | * | 4/2003 | Feher ................ 136/200 |
| 2003/0234008 A1 | * | 12/2003 | Van Winkle ........... 123/559.1 |
| 2004/0025516 A1 | * | 2/2004 | Van Winkle ........... 62/3.3 |
| 2004/0045594 A1 | | 3/2004 | Hightower |
| 2004/0124308 A1 | * | 7/2004 | Daggett .............. 244/58 |
| 2005/0022855 A1 | * | 2/2005 | Raver ............... 136/205 |
| 2005/0040712 A1 | * | 2/2005 | Hazelton ............. 310/12 |
| 2007/0006594 A1 | * | 1/2007 | Bakos et al. .......... 60/772 |

FOREIGN PATENT DOCUMENTS

| JP | 2004156827 A | 6/2004 |
|---|---|---|
| KR | 1020030057985 A | 7/2003 |

OTHER PUBLICATIONS

Robert F. Faulkner and James W. Weber, Hydrocardon Scramjet Propulsion System Development, Demonstration and Application, AIAA Paper 99-4922, American Institute of Aeronautics and Astronautics, 1999.
Richard R. Kazmar, Hypersonic Propulsion at Pratt & Whitney—Overview, AIAA 2002-5144, American Institute of Aeronautics and Astronautics, 2002.

* cited by examiner

*Primary Examiner* — Philip J Bonzell
(74) *Attorney, Agent, or Firm* — Bachman & LaPointe, P.C.

(57) ABSTRACT

A vehicle has a body and a source of a propellant. An engine is carried by the body. The engine reacts the propellant to produce thrust. The engine has a heat exchanger transferring heat from the reaction to at least a component of the propellant and generating electricity thermoelectrically.

32 Claims, 5 Drawing Sheets

ENGINE HEAT EXCHANGER WITH THERMOELECTRIC GENERATION

BACKGROUND OF THE INVENTION

The invention relates to heat exchangers. More particularly, the invention relates to exchangers using pre-combustion propellant to cool structures heated by the combustion.

A wide variety of heat exchanger technologies exist and are used in a wide variety of applications. Exemplary applications involving high differences in temperature are scramjet and rocket engines. In many such heat exchangers, heat is drawn from combusting propellant and received by incoming pre-combustion propellant or a component thereof. The heat exchangers may be positioned along combustion chambers and/or nozzles to cool such chambers or nozzles to maintain required engine life. An exemplary such use of a heat exchanger is discussed in Faulkner, R. and Weber, J., "Hydrocarbon Scramjet Propulsion System Development, Demonstration and Application", AIAA Paper 99-4922, American Institute of Aeronautics and Astronautics, 1999.

Additionally, ceramic matrix composites have been developed for use in the aerospace industry. Various composites are discussed in U.S. Pat. No. 6,627,019 of Jarmon et al. for use in cooled engine components. U.S. Pat. No. 6,907,920 of Warburton et al. discloses use of a layer of a composite in a heat exchanger panel assembly. The composite panel serves as a so-called "hot face" or hot panel. The cooling channels may be formed between the hot panel and by one or more additional panels and may be bounded by tubular inserts.

SUMMARY OF THE INVENTION

One aspect of the invention involves a vehicle having a body and a source of a propellant. An engine is carried by the body. The engine reacts the propellant to produce thrust. The engine has a heat exchanger transferring heat from the reaction to at least a component of the propellant and generating electricity thermoelectrically.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
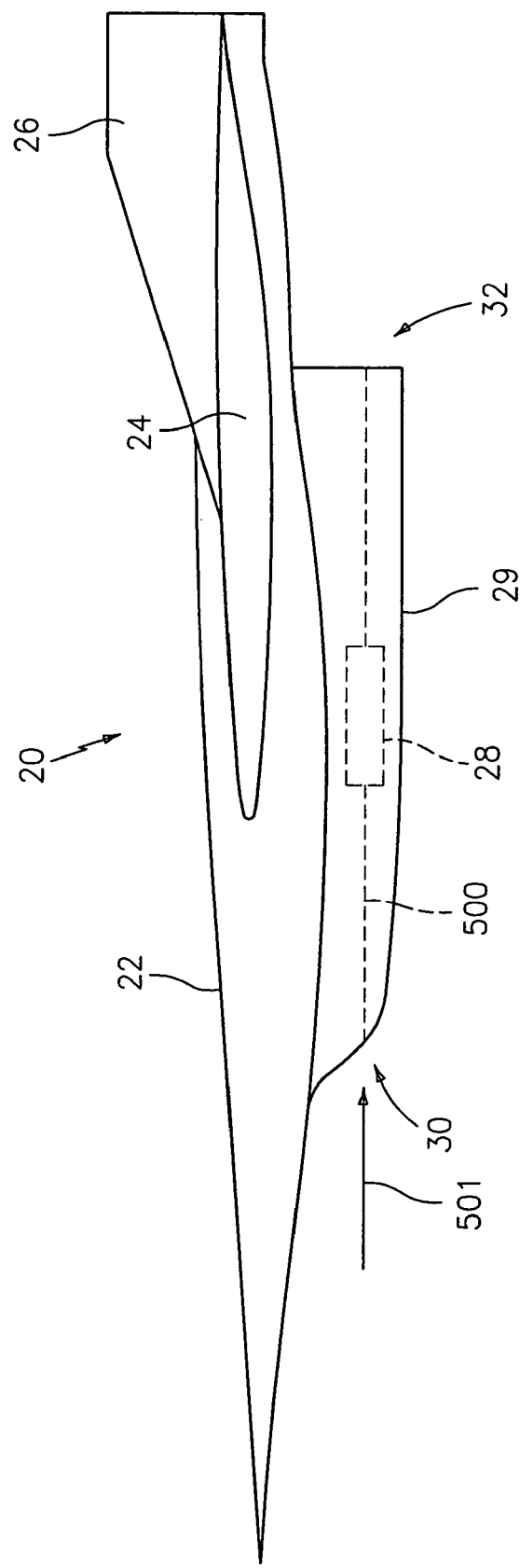
FIG. 1 is a view of an aircraft.

FIG. 1 shows a vehicle 20. An exemplary vehicle is a manned aircraft. Alternative vehicles may be unmanned and may be reusable or may be one-way vehicles (e.g., warhead-carrying missiles or disposable launch vehicles). The exemplary aircraft is a hybrid turbine and ramjet aircraft. An exemplary ramjet is a dual mode (subsonic and supersonic combustion) ramjet engine (dual mode scramjet-DMSJ).

Figure 2:
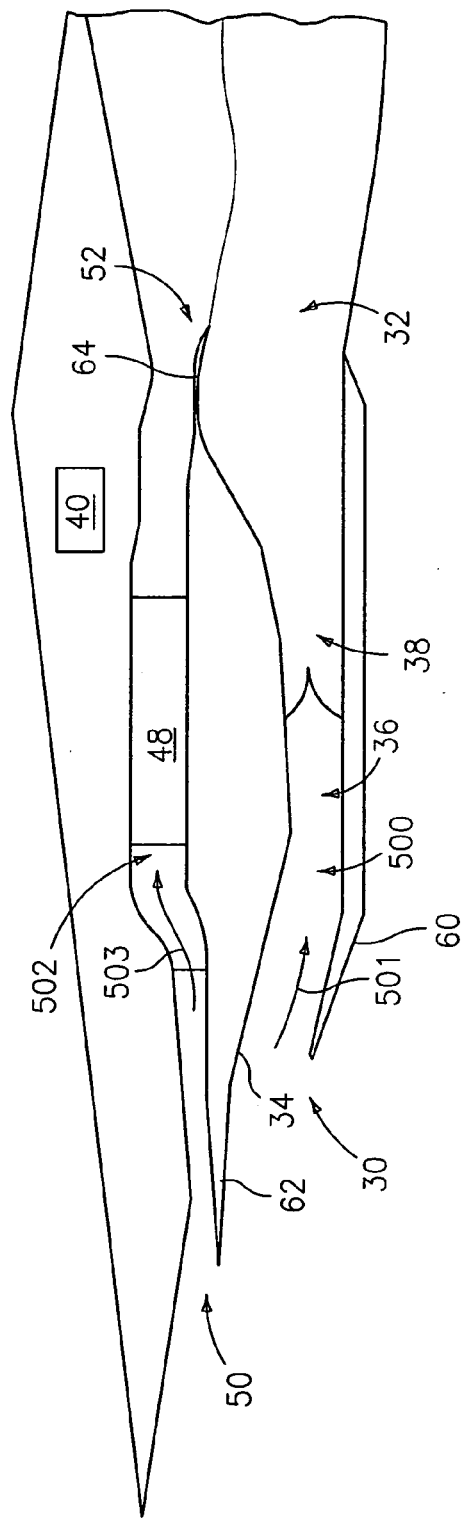
FIG. 2 is a partially schematic longitudinal sectional view of a propulsion system of the aircraft of FIG. 1.

The exemplary aircraft 20 has a fuselage 22, a wing 24, and a tail assembly 26. A dual mode scramjet engine 28 is formed in a cowl 29 on an underside of the fuselage 22. A scramjet air flowpath 500 (FIG. 2) carries a flow 501 between a forward inlet/intake 30 and an aft outlet 32 (e.g., an exhaust nozzle). Along the flowpath, the engine may include a forebody 34, an isolator 36 (often integrated therewith), and a combustor 38. A control system 40 (optionally a portion of the aircraft's avionics) may control operation of the combustor 38 in response to one or more of sensor input, operator input, and the like.

A turbine engine 48 (FIG. 2) is located along a turbine engine air flowpath 502 carrying a flow 503 between a forward inlet/intake 50 and an aft outlet 52 and inboard of the scramjet flowpath (e.g., partially recessed into the fuselage above the cowl). Scramjet and turbine inlet flaps 60 and 62 selectively block the scramjet and turbine inlets and flowpaths when the scramjet or turbine, respectively, is not in operation. Similarly a turbine outlet flap 64 selectively blocks the turbine flowpath when the turbine is not in use so as to provide an efficient nozzle for the scramjet. This configuration is merely exemplary.

Figure 3:
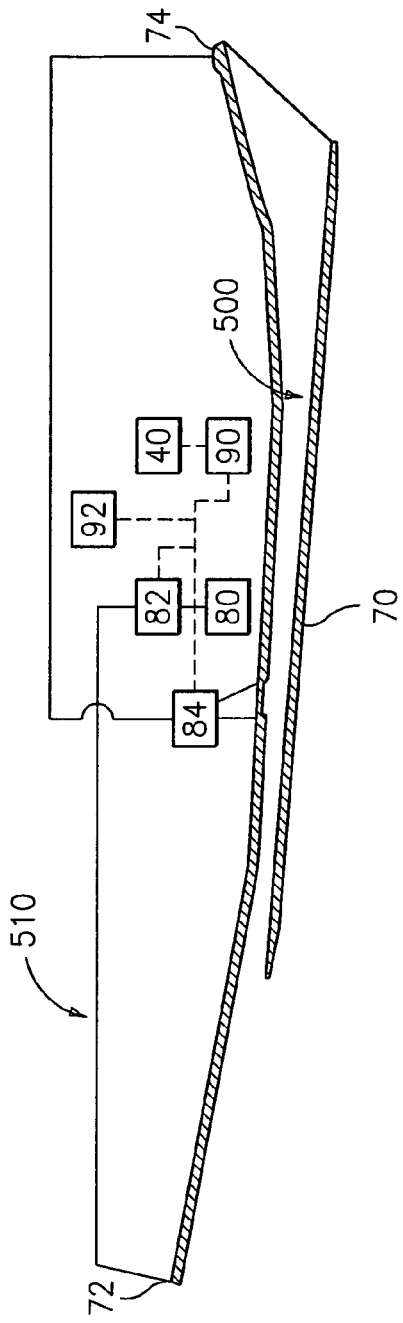
FIG. 3 is a partially schematic view of a scramjet portion of the system of FIG. 2.

FIG. 3 shows further details of the scramjet engine 28 and flowpath 500. The flowpath 500 is largely encircled by a heat exchanger 70 for transferring heat from the air and combustion gases to pre-combustion scramjet fuel. For an exemplary hydrocarbon-based liquid fuel (e.g., JP-8) the heat exchanger 70 is a liquid-gas heat exchanger. An alternate exemplary fuel is hydrogen gas. The exemplary heat exchanger 70 may have an upstream liquid fuel inlet 72 and a downstream liquid fuel outlet 74. In the exemplary embodiment, the inlet 72 may be upstream of the combustor 38 along the flowpath 500 because pre-combustion aerodynamic heating may be relevant. A fuel flowpath 510 for the scramjet fuel may extend from a storage tank 80 to a fuel pump 82 and then to the inlet 72. After exiting the outlet 74, heated fuel may pass along the flowpath 510 to a fuel distribution valve network 84 and then to the combustor. The valves of the network 84 distribute the fuel to various combustor locations for various purposes (e.g., piloting v. main combustion) and to achieve desired staging.

The exemplary heat exchanger 70 thermoelectrically generates the electricity. Accordingly, the exchanger 70 may be coupled to an electrical power conditioning, storage, and distribution system 90. The system 90 may receive raw electrical input from the heat exchanger 70 and output appropriate electricity (e.g., of a constant and proper voltage) to drive the control system 40, fuel pump 82, distribution valves of the network 84, similar components associated with the turbine engine, and additional loads schematically shown as 92.

Figure 4:
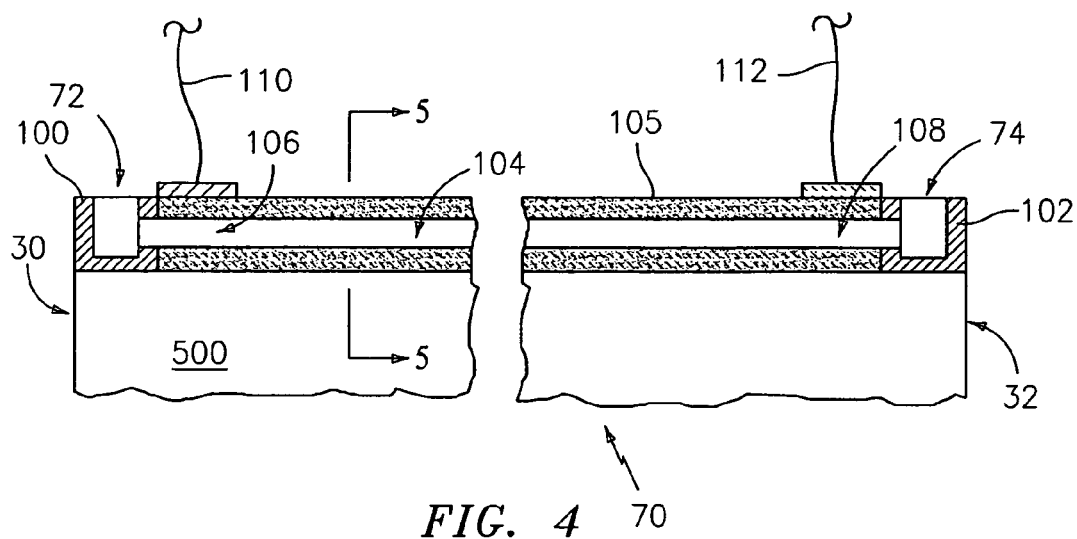
FIG. 4 is a partially schematic view of a heat exchanger of the system of FIG. 3.

FIG. 4 semi-schematically shows the heat exchanger 70. The inlet 72 may be formed in an inlet manifold 100. The outlet 74 may be formed in an outlet manifold 102. Extending between the manifolds, an array of channels or passageways 104 may extend in a main body 105 from an upstream end 106 to a downstream end 108. Fluidically, the exemplary passageways 104 may be in parallel. However, other configurations (e.g., serpentine) are possible. Similarly, although the exemplary passageways are shown having parallel flow relative to the flowpath 500, other configurations are possible (e.g., counterflow, crossflow, or combinations, a well as multi-inlet/outlet exchangers, exchanger assemblies, and the like). First and second electrical leads 110 and 112 may extend to the system 90. As with the fluid coupling, there are many options for the electrical coupling and several are discussed in further detail below.

Figure 5:
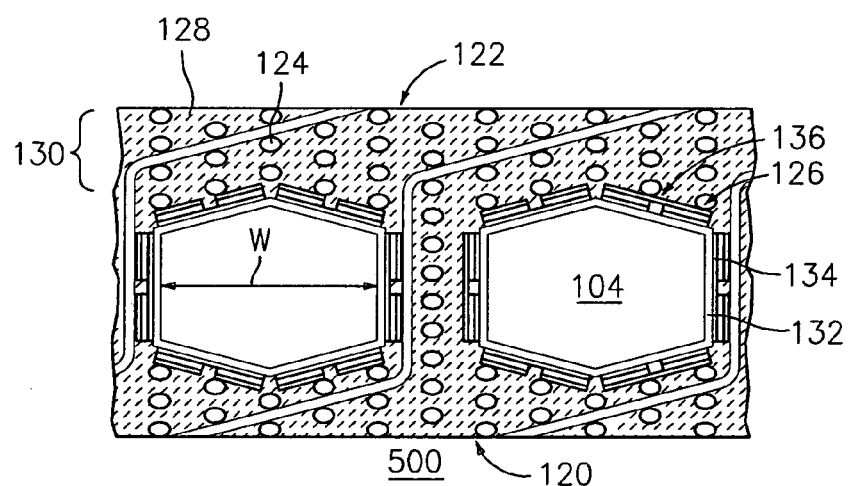
FIG. 5 is a partially schematic transverse sectional view of the heat exchanger of FIG. 4.

FIG. 5 shows further details of one non-limiting exemplary heat exchanger body 105. An interior/inboard surface 120 faces/bounds the flowpath 500. An exterior/outboard surface 122 is opposite the surface 120 and typically at a lower temperature. The exemplary body is a composite (e.g., as ceramic composite) structure including structural fibers 124 and channel-forming assemblies 126 in a matrix 128. In the exemplary implementation, the assemblies 126 are relatively close to the surface 120 for receipt of heat. The fibers 124 in an outboard portion 130 thus provide a principal structural portion of the body 105. Exemplary structural fibers 124 are silicon carbide fiber (SiC) tows. An exemplary matrix material is melt-infiltrated silicon carbide (e.g., silicon carbide deposited by chemical vapor infiltration followed by a silicon metal melt to fill/seal porosity). Exemplary manufacturing techniques for such composites are discussed in U.S. Pat. No. 6,627,019 of Jarmon et al.

The exemplary assemblies 126 include a liner 132 surrounding and defining the associated channel 104. While numerous transverse section geometries are possible, the exemplary liners 132 are polygonal in transverse section. The exemplary shape is a flattened hexagon of essentially equal-length sides. Flattening to increase a channel width W parallel to the surface 120 increases potential heat transfer. The flat exterior facets 134 facilitate the mounting of thermoelectric device assemblies 136 thereon. As is discussed further below, the assemblies 126 may comprise arrays of P-type and N-type material elements. Conductors within each array couple the elements. Additionally, the arrays may be coupled to each other in a variety of ways and, ultimately, to the conductors 110 and 112 to deliver power to the system 90. Exemplary thermoelectric devices are shown in U.S. Pat. No. 6,300,150 of Venkatasubramanian.

Figure 6:
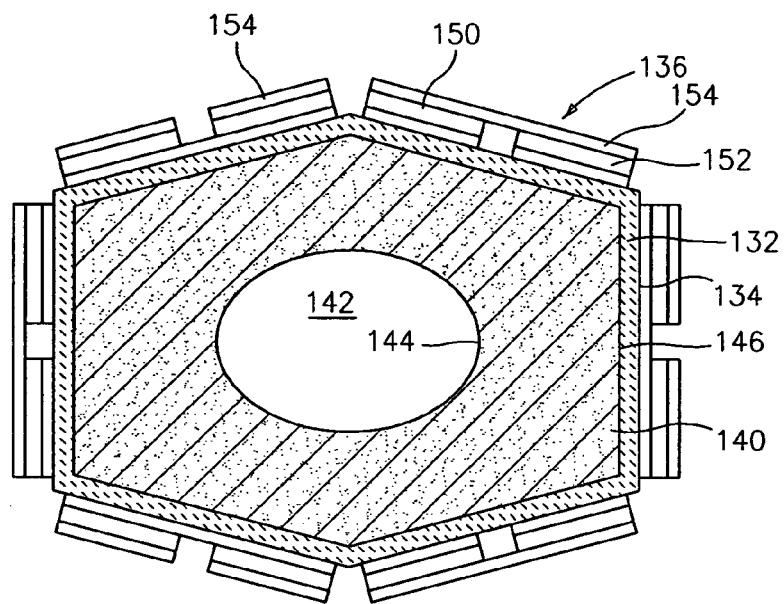
FIG. 6 is an end view of a precursor of a thermoelectric component of the heat exchanger of FIG. 5.
Figure 7:
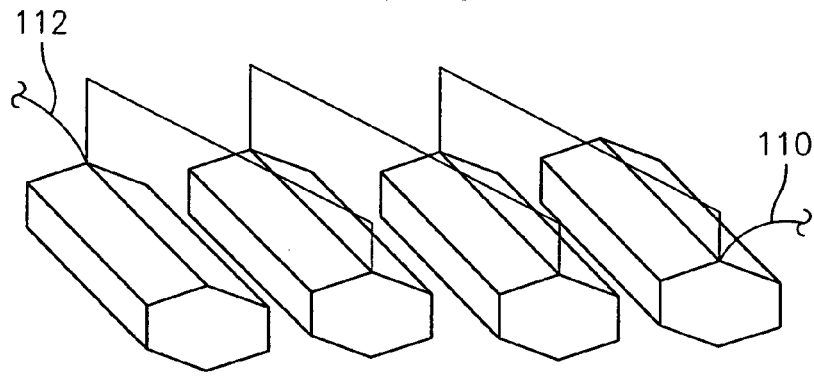
FIG. 7 is a schematic view of series-interconnected components of FIG. 6.
Figure 8:
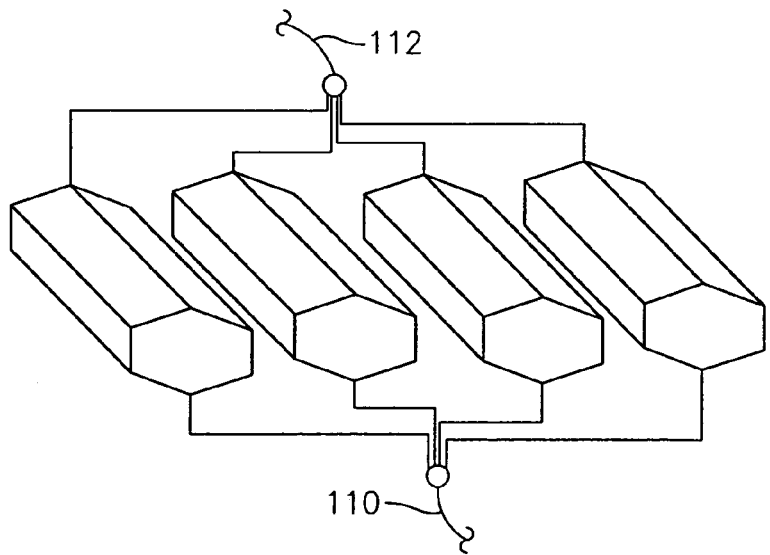
FIG. 8 is a schematic view of parallel-interconnected components of FIG. 6.

One exemplary non-limiting method of manufacture utilizes sacrificial rods 140 to form the assemblies 126 (FIG. 6). The exemplary rods 140 may be carbon based (e.g., graphite-epoxy composites). Exemplary rods may have a polygonal transverse section (e.g., as described above). The exemplary rods 140 may be manufactured with pre-formed central channels 142 (e.g., by extrusion) bounded by interior surfaces 144. As is discussed in further detail below, the channels 142 (if present) may provide access for chemicals or high temperature gas to at least partially decompose the rods 140 after further assembly steps. The rods 140 may be coated with a sacrificial or non-sacrificial coating that may serve a variety of purposes. Exemplary non-sacrificial coating is a ceramic coating atop the rod exterior surfaces 146 to ultimately form the liner layer 132. If present, the device arrays 136 may be applied atop each of the resulting faces 134. The exemplary arrays 136 may include interspersed arrays of P-type elements 150 and N-type elements 152 electrically interconnected by conductors 154. The arrays 136 of a given assembly 126 may be connected (e.g., in series or parallel). Alternatively, the elements of each array 136 may be fully interconnected with the other arrays so as to form a continuous array. The assemblies 126 may, in turn, be connected in series (FIG. 7) or parallel (FIG. 8).

Either before or after the interconnection of the assemblies 126, the assemblies 126 may be mechanically assembled in the composite structure. The rods 140 may then be fully or partially removed by chemical, thermal, and/or mechanical means so as to expand the channels 142 to form the channels 104. For example, the Jarmon et al. patent discloses an oxidative removal (e.g., by heating in air to 650° C. for forty-eight hours) of channel-forming elements.

Figure 9:
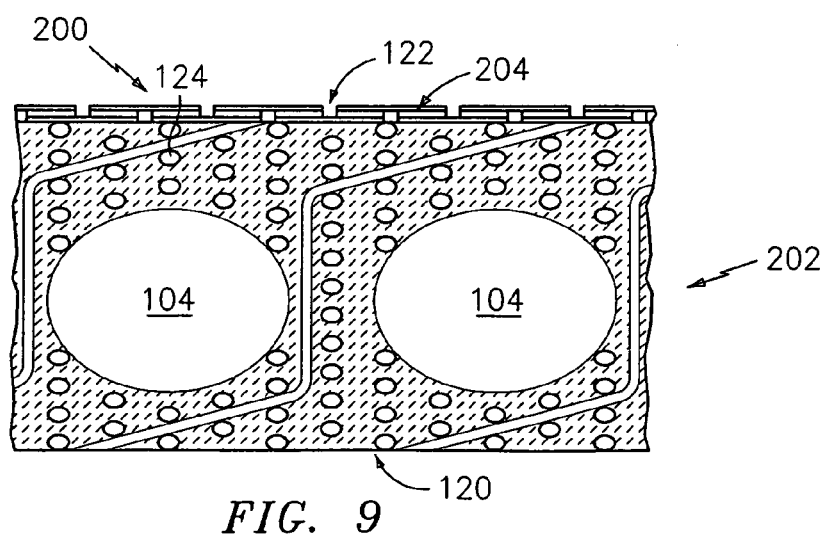
FIG. 9 is a partially schematic transverse sectional view of a first alternate heat exchanger.

FIG. 9 shows an alternate heat exchanger 200 having a body 202 that may be similar to the heat exchanger body 105. Distinguished from the thermoelectric devices of the body 105, the thermoelectric devices 204 are more remote from the individual channels 104 rather than surrounding them. In the exemplary body 202, the devices 204 are arrayed as a layer along or near the near the exterior/outboard surface 122. The devices 204 may be applied after formation of the composite material of the body 202. Alternatively, to embed the devices, the devices 204 may be applied during the laying up of fiber tows 124.

Figure 10:
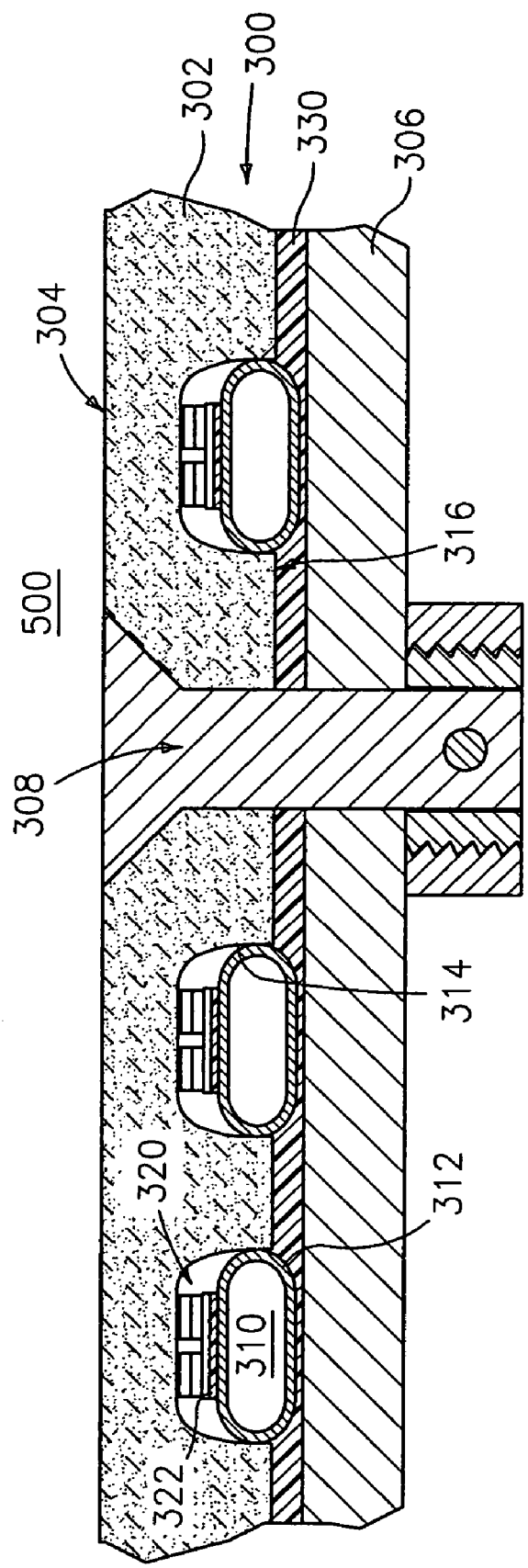
FIG. 10 is a partially schematic transverse sectional view of a second alternate heat exchanger.

FIG. 10 shows an alternate heat exchanger formed as a panel assembly 300. The exemplary assembly 300 may have a hot panel 302 having a first surface 304 along the scramjet air flowpath 500. The hot panel 302 may be formed as a SiC/SiC composite as disclosed in the Jarmon et al. and Warburton et al. patents. The hot panel 302 may be mounted to a structural substructure or back structure 306 (e.g., as disclosed in the Warburton et al. patent). The exemplary substructure 306 may be a metallic panel. The panels 302 and 306 may be secured by fasteners 308 (e.g., as disclosed in the Warburton et al. patent).

In the exemplary non-limiting panel assembly 300, the cooling channels 310 are defined within metal tubular conduits 312. The exemplary conduits 312 are partially recessed in open channels 314 in the second surface 316 of the hot panel 302. For improved heat transfer, the exemplary conduits 312 are elongate (e.g., obround) in transverse cross-section and oriented parallel to the surface 304. Thermoelectric device arrays 320 are mounted to the conduits 312. In the exemplary configuration, the device arrays 320 are on the hot side of the conduits 312. An electrical insulator layer 322 may be included with the device arrays to electrically insulate them from the conduits (if the conduits are conductive). The insulator layer 322 may be included in the as-applied arrays 320 or may be pre-applied to the conduits (e.g., as a strip or a coating). In the exemplary assembly, a thermal insulation layer 330 is positioned between the panels 302 and 306.

In addition to the generation of power for powering various on-board aircraft systems, the various aforementioned thermoelectric devices may be utilized to monitor (e.g., by the control system 40) operational and conditional parameters of the engine. For example, a local power increase might indicate a local thinning, cracking, or other wear or damage condition. This information could be used for several further purposes. The information can be used to provide a warning to a pilot or other operator. The information can be used to change operational conditions to avoid or defer failure (e.g., throttling back, altering fuel staging, and the like). For a reusable craft, the information can be used to determine a need for maintenance. Such maintenance might involve heat exchanger or panel replacement. For example, in the panel assembly 300 of FIG. 10, an indicated degradation of the hot panel 302 could signal that the panel be inspected and replaced, if appropriate. In such a replacement, the substructure 306 as well as the conduits 312 and their associated thermoelectric device arrays 320 could be retained.

One or more embodiments of the present invention have been described. Nevertheless, it will be understood that various modifications may be made without departing from the spirit and scope of the invention. For example, when applied in a reengineering of an existing heat exchanger or for an existing application, details of the existing heat exchanger or application may influence details of any particular implementation. Accordingly, other embodiments are within the scope of the following claims.

What is claimed is:

1. A vehicle comprising:
   a body;
   a source of a propellant; and
   an engine carried by the body, the engine reacting the propellant to produce thrust, wherein the engine comprises:
   a thermoelectric heat exchanger transferring heat from the reaction to at least a component of the propellant and generating electricity thermoelectrically and comprising:
      at least one conduit element carrying the component;
      thermoelectric devices applied to the at least one conduit element; and
      a ceramic composite panel to which the at least one conduit element is secured.

2. The vehicle of claim 1 wherein:
   the propellant comprises at least one of hydrogen gas and a hydrocarbon-based fuel.

3. The vehicle of claim 1 being an on-board piloted vehicle.

4. The vehicle of claim 1 wherein the engine is at least partially within a central lower nacelle.

5. The vehicle of claim 1 wherein the vehicle lacks a power generation system separate from the thermoelectric heat exchanger.

6. The vehicle of claim 1 wherein the heat exchanger is a parallel flow heat exchanger.

7. The vehicle of claim 1 further comprising:
   a control system configured to monitor said electricity to determine a health condition of said heat exchanger.

8. The vehicle of claim 1 wherein:
   the at least one component comprises a hydrocarbon-based fuel.

9. The vehicle of claim 1 wherein:
   the at least one component comprises said hydrocarbon-based fuel as a liquid.

10. The vehicle of claim 1 wherein:
    the ceramic composite panel has at least one open channel, open transverse to a length of the channel, in which the at least one conduit element is at least partially recessed.

11. The vehicle of claim 10 wherein:
    the at least one conduit element is elongate in transverse cross-section oriented parallel to a surface of the ceramic composite panel, which surface is along an air flowpath; and
    the thermoelectric devices are along a side of the at least one conduit element facing the air flowpath.

12. The vehicle of claim 10 wherein:
    the at least one open channel is open to a surface of the ceramic composite panel.

13. The vehicle of claim 12 wherein:
    the at least one conduit element comprises a metallic tubular conduit.

14. The vehicle of claim 13 wherein:
    the metallic tubular conduit partially protrudes from the ceramic composite panel.

15. A vehicle comprising:
    a body;
    a source of a propellant; and
    an engine carried by the body, the engine comprising:
    a combustor for reacting the propellant to produce thrust; and
    means for thermoelectric generation of electricity and feeding back heat from the reacting to at least one component of the propellant before the reacting, the means comprising a heat exchanger comprising:
       at least one conduit element carrying the component;
       thermoelectric devices applied to the at least one conduit element; and
       a ceramic composite panel to which the at least one conduit element is secured.

16. The vehicle of claim 15 wherein:
    the engine is a scramjet; and
    the at least one component is hydrogen gas or a hydrocarbon-based fuel.

17. The vehicle of claim 15 wherein the means comprise:
    a plurality of channels for carrying the at least one component; and
    at least one array of p-n junctions.

18. A method for operating the vehicle of claim 1 comprising:
    monitoring said electricity to determine a condition of the engine.

19. The method of claim 18 wherein:
    the condition includes a condition of the heat exchanger.

20. The method of claim 19 further comprising:
    responsive to said monitoring, replacing or repairing a hot panel of said heat exchanger.

21. A method for manufacturing the vehicle of claim 1 comprising:
    providing said at least one conduit element;
    applying said thermoelectric devices to the at least one conduit element; and
    securing the at least one conduit element to said ceramic composite panel.

22. The method of claim 21 wherein:
    the securing comprises assembling the ceramic composite panel to a structural panel with the at least one conduit element therebetween.

23. A vehicle comprising:
    a body;
    a source of a propellant; and
    an engine for reacting the propellant to produce thrust and comprising a heat exchanger for transferring heat from the reaction to at least a component of the propellant and comprising:
       at least one conduit element carrying the component;
       thermoelectric devices applied to the at least one conduit element; and
       a ceramic composite panel to which the at least one conduit element is secured.

24. The vehicle of claim 23 wherein:
    the ceramic composite panel has at least one open channel, open transverse to a length of the channel, in which the at least one conduit element is partially recessed.

25. The vehicle of claim 23 wherein the heat exchanger further comprises:
    a structural panel secured to the ceramic composite panel with the at least one conduit element therebetween.

26. The vehicle of claim 1 wherein:
    the ceramic composite panel has at least one open channel, open transverse to a length of the channel, in which the at least one conduit element is partially recessed.

27. The vehicle of claim 1 wherein the heat exchanger further comprises:
    a structural panel secured to the ceramic composite panel with the at least one conduit element therebetween.

28. The vehicle of claim 23 wherein:
the ceramic composite panel has at least one open channel, open transverse to a length of the channel, in which the at least one conduit element is at least partially recessed.

29. The vehicle of claim 28 wherein:
the at least one conduit element is elongate in transverse cross-section oriented parallel to a surface of the ceramic composite panel, which surface is along an air flowpath; and
the thermoelectric devices are along a side of the at least one conduit element facing the air flowpath.

30. The vehicle of claim 28 wherein:
the at least one open channel is open to a surface of the ceramic composite panel.

31. The vehicle of claim 30 wherein:
the at least one conduit element comprises a metallic tubular conduit.

32. The vehicle of claim 31 wherein:
the metallic tubular conduit partially protrudes from the ceramic composite panel.

* * * * *